US012785709B2

(12) United States Patent
Ramachandra

(10) Patent No.: US 12,785,709 B2
(45) Date of Patent: Nov. 3, 2026

(54) PIPELINE SUCCESSIVE APPROXIMATION ANALOG-TO-DIGITAL CONVERTER RESIDUE AMPLIFIER OFFSET CANCELLATION

(71) Applicant: MEDIATEK INC., Hsinchu (TW)

(72) Inventor: Nikhil Ramachandra, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 167 days.

(21) Appl. No.: 18/788,603

(22) Filed: Jul. 30, 2024

(65) Prior Publication Data

US 2025/0088197 A1 Mar. 13, 2025

Related U.S. Application Data

(60) Provisional application No. 63/581,026, filed on Sep. 7, 2023.

(51) Int. Cl.

*H03M 1/38* (2006.01)
*H03M 1/06* (2006.01)
*H03M 1/10* (2006.01)

(52) U.S. Cl.

CPC ....... *H03M 1/1023* (2013.01); *H03M 1/0607* (2013.01)

(58) Field of Classification Search

CPC .... H03M 1/164; H03M 1/468; H03M 1/0695; H03M 1/466; H03M 1/804; H03M 1/1215; H03M 1/145; H03M 1/1023; H03M 1/46; H03M 1/462; H03M 1/00; H03M 1/06; H03M 1/10; H03M 1/1014; H03M 1/1019; H03M 1/1028; H03M 1/1061; H03M 1/12; H03M 1/167; H03M 1/50; H03M 1/0607; H03M 1/0687; H03M 1/069;

(Continued)

(56) References Cited

U.S. PATENT DOCUMENTS 6,879,277 B1 * 4/2005 Cai ........................ H03M 1/164 341/172
8,659,461 B1 * 2/2014 Zhu ...................... H03M 1/1019 341/155

(Continued)

OTHER PUBLICATIONS

Bob Verbruggen et al., A 1.7 mW 11b 250 MS/s 2-Times Interleaved Fully Dynamic Pipelined SAR ADC in 40 nm Digital CMOS, IEEE Journal of Solid-State Circuits, vol. 47, No. 12, 2012.

(Continued)

*Primary Examiner* — Linh V Nguyen
(74) *Attorney, Agent, or Firm* — Winston Hsu

(57) ABSTRACT

A controller obtains a first calibrated gain of a residue amplifier. The residue amplifier amplifies a first residue voltage to a voltage corresponding to a first output code of a second stage of the pipelined ADC. The first residue voltage is output from a capacitive digital-to-analog converter (CDAC) of a first stage of the pipelined ADC. The controller obtains a second calibrated gain of the residue amplifier. The residue amplifier amplifies a second residue voltage to a voltage corresponding to a second output code of the second stage of the pipelined ADC. The second residue voltage is output from the CDAC of the first stage of the pipelined ADC. The controller determines a final calibrated gain of the residue amplifier based on the first calibrated gain and the second calibrated gain.

18 Claims, 12 Drawing Sheets

(58) Field of Classification Search

CPC ............. H03M 1/1004; H03M 1/1009; H03M 1/1057; H03M 1/121; H03M 1/124; H03M 1/14; H03M 1/162; H03M 1/34; H03M 1/361; H03M 1/38; H03M 1/403; H03M 1/44; H03M 1/502; H03M 1/742; H03M 1/806; H03M 3/32

USPC ................. 341/155, 161, 162, 172, 118, 120

See application file for complete search history.

(56) References Cited

U.S. PATENT DOCUMENTS

| | | | | |
|---|---|---|---|---|
| 9,413,373 | B1 * | 8/2016 | Ishii | H03M 1/1061 |
| 10,608,655 | B1 * | 3/2020 | Li | H03M 1/1057 |
| 11,855,651 | B2 * | 12/2023 | Lok | H03M 1/0607 |
| 2013/0214946 | A1 * | 8/2013 | Verbruggen | H03M 1/06 341/118 |
| 2016/0352349 | A1 * | 12/2016 | Yoshioka | H03M 1/124 |
| 2019/0131992 | A1 * | 5/2019 | Ali | H03M 1/1004 |
| 2021/0226643 | A1 * | 7/2021 | Moon | H03M 1/742 |
| 2022/0337258 | A1 * | 10/2022 | Shen | G11C 27/024 |

OTHER PUBLICATIONS

Jianyu Zhong et al, A 12b 180MS/s 0.068mm2 With Full Calibration Integrated Pipelined SAR ADC, IEEE Transactions on Circuits and Systems-I: Regular Papers, vol. 64, No. 7, 2017.

Yan Zhu et al, A 50-fJ 10-b 160-MS/s Pipelined-SAR ADC Decoupled Flip-Around MDAC and Self-Embedded Offset Cancellation, IEEE Journal of Solid-State Circuits, vol. 47, No. 11, 2012.

Jun Deguchi et al., A 187.5pVrms-Read-NOise 51mW 1.4MPixeL CMOS Image SensOr with PMOSCAP COLumn CDS and 10b SeLf-DifferentiaL Offset-CanceLLed PiPeLine SAR-ADC, ISSCC 2013/Session 27/Ima6e Sensors/27.9, 2013.

Yan Zhu et al, A 35 fJ 10b 160 MS/s Pipelined-SAR ADC with Decoupled Flip-Around MDAC and Self-Embedded Offset Cancellation, IEEE Asian Solid-State Circuits Conference, 2011/ Jeju, Korea.

Yan Zhu et al, An 11b 450 MS/s Three Way Time Interleaved Subranging Pipelined SAR ADC in 65 nm CMOS, IEEE Journal of Solid State Circuits, 2016.

Lukas Kull et al., A 10b 1.5GS/s Pipelined-SAR ADC with Background Second-Stage Common-Mode Regulation and Offset Calibration in 14nm CMOS FinFET, ISSCC 2PQW / Session 28 / Hybrid Adcs / 28NU, 2017.

* cited by examiner

| Input | Output |
|---|---|
| 111 | 0.875V |
| 110 | 0.625V |
| 101 | 0.375V |
| 100 | 0.125V |
| 011 | -0.125V |
| 010 | -0.375V |
| 001 | -0.625V |
| 000 | -0.875V |

| SAR Cycle | 1 | 2 | 3 | 4 | Result |
|---|---|---|---|---|---|
| $V_{in}$ | 0.7 V | 0.7 V | 0.7 V | 0.7 V | 0.7 V |
| CDAC Output | 0 V | -0.5 V | -0.75 V | -0.625 V | -0.625 V |
| Residue (Comparator Input) | 0.7 V | 0.2 V | -0.05 V | 0.075 V | 0.075 V |
| Comparator Output | 1 | 1 | 0 | 1 | - |
| Digital Input | 1-- | 11- | 110 | 110 | 110 |
| SAR ADC Output | 1000 | 1100 | 1100 | 1101 | 1101 |
| Corresponding Decimal | > 7 | > 12 | > 12, < 14 | < 14, > 13 | 13 |

PIPELINE SUCCESSIVE APPROXIMATION ANALOG-TO-DIGITAL CONVERTER RESIDUE AMPLIFIER OFFSET CANCELLATION

CROSS-REFERENCE TO RELATED APPLICATION(S)

This application claims the benefits of U.S. Provisional Application Ser. No. 63/581,026, entitled "PIPELINE SUCCESSIVE APPROXIMATION ANALOG-TO-DIGITAL CONVERTER RESIDUE AMPLIFIER OFFSET CANCELLATION" and filed on Sep. 7, 2023, which is expressly incorporated by reference herein in its entirety.

BACKGROUND

Field

The present disclosure relates generally to analog-to-digital converters (ADCs), and more particularly, to techniques of calibrating and compensating for residue amplifier offset in pipelined successive approximation register (SAR) ADCs to improve conversion accuracy.

Background

Analog-to-digital converters (ADCs) play a crucial role in modern electronics, bridging the gap between the analog representations of physical quantities and digital representations of computation and processing. These circuits are responsible for converting continuous-time, continuous-valued analog signals, such as temperature, pressure, and audio, into discrete-time, discrete-valued digital representations. This digital information can then be readily manipulated, stored, and transmitted using digital systems.

Among various ADC architectures, Successive Approximation Register (SAR) ADCs have gained significant popularity due to their good balance of speed, resolution, and power consumption. SAR ADCs utilize a binary search algorithm to successively approximate the input analog voltage, achieving efficient conversion with relatively simple circuitry. However, traditional SAR ADCs face limitations in conversion speed as they need to complete all the comparison and bit cycling steps before acquiring a new sample.

To overcome this speed limitation and achieve higher sampling rates, pipeline SAR ADCs have been developed. These ADCs employ multiple stages operating in parallel, with each stage handling a portion of the conversion process. The pipeline architecture effectively divides the conversion task into smaller steps, allowing for concurrent processing and significantly faster conversion speeds compared to single-stage SAR ADCs. However, pipeline SAR ADCs introduce additional challenges, particularly concerning inter-stage signal transfer and the need for accurate residue amplification.

One critical aspect of pipeline SAR ADCs is the residue amplifier, which is responsible for amplifying the residue voltage from the first stage to the full-scale input range of the subsequent stage. The accuracy of the residue amplifier's gain and offset directly impacts the overall conversion accuracy of the pipeline SAR ADC.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a controller. The controller obtains a first calibrated gain of a residue amplifier. The residue amplifier amplifies a first residue voltage to a voltage corresponding to a first output code of a second stage of the pipelined ADC. The first residue voltage is output from a capacitive digital-to-analog converter (CDAC) of a first stage of the pipelined ADC. The controller obtains a second calibrated gain of the residue amplifier. The residue amplifier amplifies a second residue voltage to a voltage corresponding to a second output code of the second stage of the pipelined ADC. The second residue voltage is output from the CDAC of the first stage of the pipelined ADC. The controller determines a final calibrated gain of the residue amplifier based on the first calibrated gain and the second calibrated gain.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
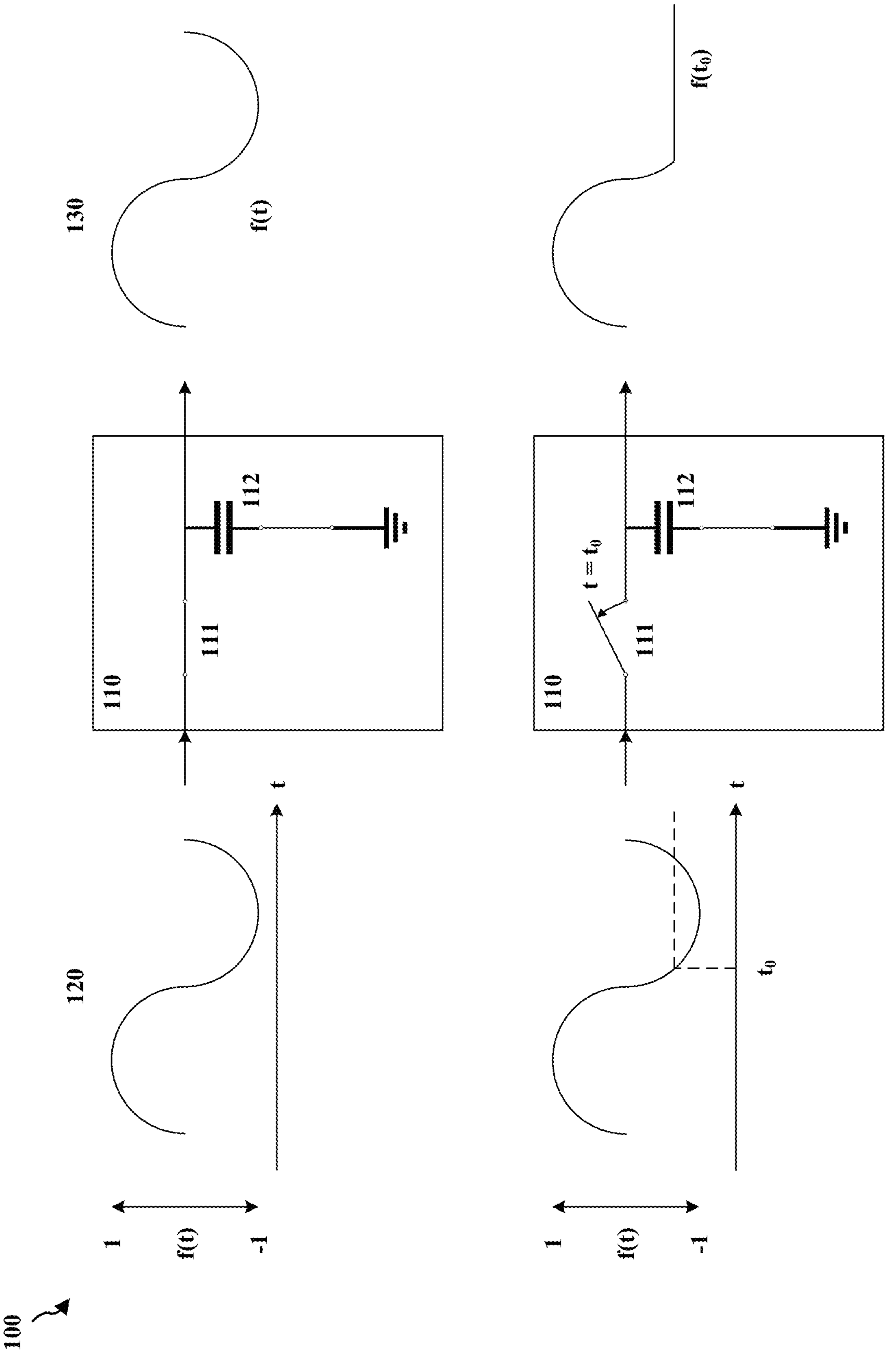
FIG. 1 is a diagram illustrating an analog signal sampler.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunications systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram 100 illustrating an analog signal sampler. An analog signal 120, denoted as f(t), is a signal that is continuous in time and can have continuous values. Examples of analog signals include physical quantities like temperature, water pressure, etc. In contrast, a digital signal is discrete in time and takes on discrete codes or values.

An analog-to-digital converter (ADC) is a circuit that "samples" an analog signal at discrete time points and finds the nearest corresponding digital code to represent the analog value. The process of converting an analog signal to a digital signal involves two key steps: sampling and quantization.

An analog signal sampler 110 is a circuit that performs the sampling step. It includes a switch 111 and a sampling capacitor 112. The switch 111 connects the time-continuous analog signal f(t) 120 to the top plate of the sampling capacitor 112. The bottom plate of the sampling capacitor 112 is connected to ground.

When the switch 111 is closed, the output 130 of the analog signal sampler 110 follows the analog input signal f(t) 120. At a specific time point to, the switch 111 is opened, disconnecting the analog signal from the sampling capacitor. At this instant, the signal value $f(t_0)$ is sampled and held on the sampling capacitor 112. The output 130 of the analog signal sampler 110 remains at the sampled value $f(t_0)$, effectively "freezing" the analog signal at that time point.

The analog signal sampler allows the ADC to capture the instantaneous value of the analog signal at a given moment in time. This sampled value is then processed by the quantization stage of the ADC to find the closest digital code representation.

In the example shown in the diagram, the analog signal f(t) varies between −1 volt and 1 volt. After sampling and quantization, the ADC converts this continuous signal into a discrete digital signal with codes (e.g., ranging from 0 to 63). The number of discrete codes depends on the resolution of the ADC, which is determined by the number of bits used to represent the digital signal.

By using an analog signal sampler in combination with a quantizer, an ADC can effectively convert continuous analog signals into discrete digital representations that can be processed by digital systems.

Figure 2:
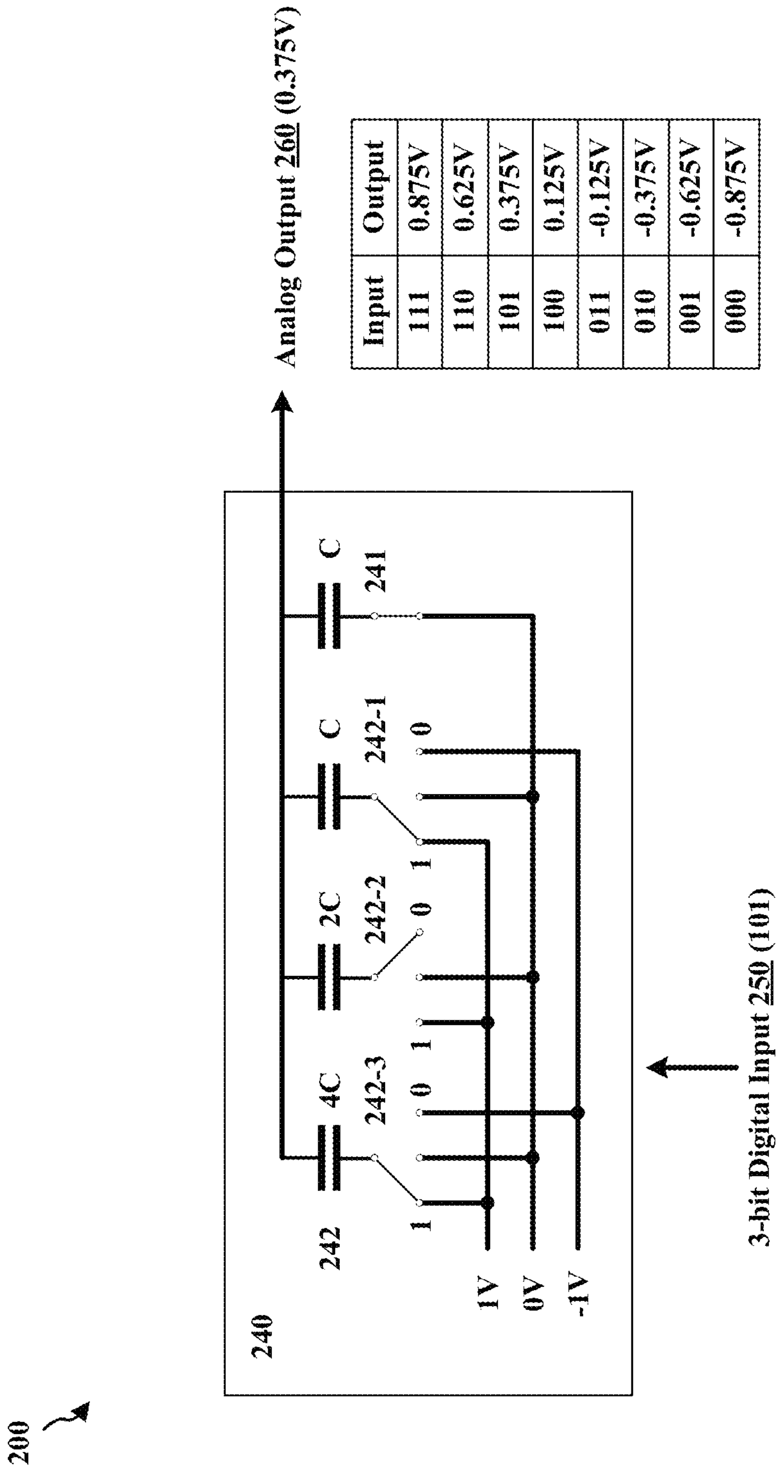
FIG. 2 is a diagram illustrating an example of a 3-bit capacitive digital-to-analog converter (CDAC).

FIG. 2 is a diagram 200 illustrating an example of a 3-bit capacitive digital-to-analog converter (CDAC). A CDAC is a circuit that converts a digital input signal into a corresponding analog output voltage. The CDAC 240 includes binary-weighted capacitors 242 and a unit capacitor 241. The binary-weighted capacitors 242 have relative weightings that are powers of two. In this example, there are three capacitors 242-1, 242-2, and 242-3 with capacitance values of C, 2C, and 4C respectively, where C is a unit capacitance. The unit capacitor 241 also has a capacitance of C. The top plates of all the capacitors are connected together, forming the analog output 260 of the CDAC.

The digital input 250 to the CDAC controls the voltages applied to the bottom plates of the binary-weighted capacitors 242. Each bit of the digital input corresponds to one of the binary-weighted capacitors. In this example, if a bit is '1', the corresponding capacitor's bottom plate is connected to the maximum reference voltage $V_{refp}$, which is 1V in this example. If a bit is '0', the bottom plate is connected to the minimum reference voltage $V_{refn}$, which is −1V. The bottom plate of the unit capacitor 241 is always connected to ground.

The resulting analog output 260 is a weighted sum of the reference voltages, with the weights determined by the capacitance values and the digital input. For an n-bit CDAC, the output voltage Vout for a digital input $D=(d_{n-1}, d_{n-2}, \ldots, d_0)$ is given by:

$$V_{out} = \frac{1}{2^n}\sum_{k=0}^{n-1} d_k \cdot 2^k \cdot (V_{refp} - V_{refn}) + V_{refn}$$

where $d_k$ is the k-th bit of the digital input (0 or 1), and n is the number of bits.

The smallest change in the analog output voltage, corresponding to a change of 1 in the least significant bit (LSB) of the digital input, is called the LSB voltage. For an n-bit CDAC with a reference voltage range of $V_{refp}$-$V_{refn}$, the LSB voltage is:

$$V_{LSB} = \frac{V_{refp} - V_{refn}}{2^n}$$

In the 3-bit example shown, with $V_{refp}$=1V and $V_{refn}$=−1V, the LSB voltage is $$V_{LSB} = \frac{1V - (-1V)}{2^3} = 0.25\text{ V}.$$

In this example, the unit capacitor 241, which is the last capacitor in the CDAC, is not controlled by the digital input. Its bottom plate remains connected to ground. The purpose of this unit capacitor is to provide a constant capacitance such that the total capacitance of the CDAC remains the same for all digital input codes.

The CDAC allows for a direct mapping between the digital input code and the analog output voltage. Each possible digital input code corresponds to a unique analog voltage level. By appropriately setting the reference voltages and sizing the capacitors, the CDAC can be designed to cover a desired analog output range with a specified resolution.

Figure 3:
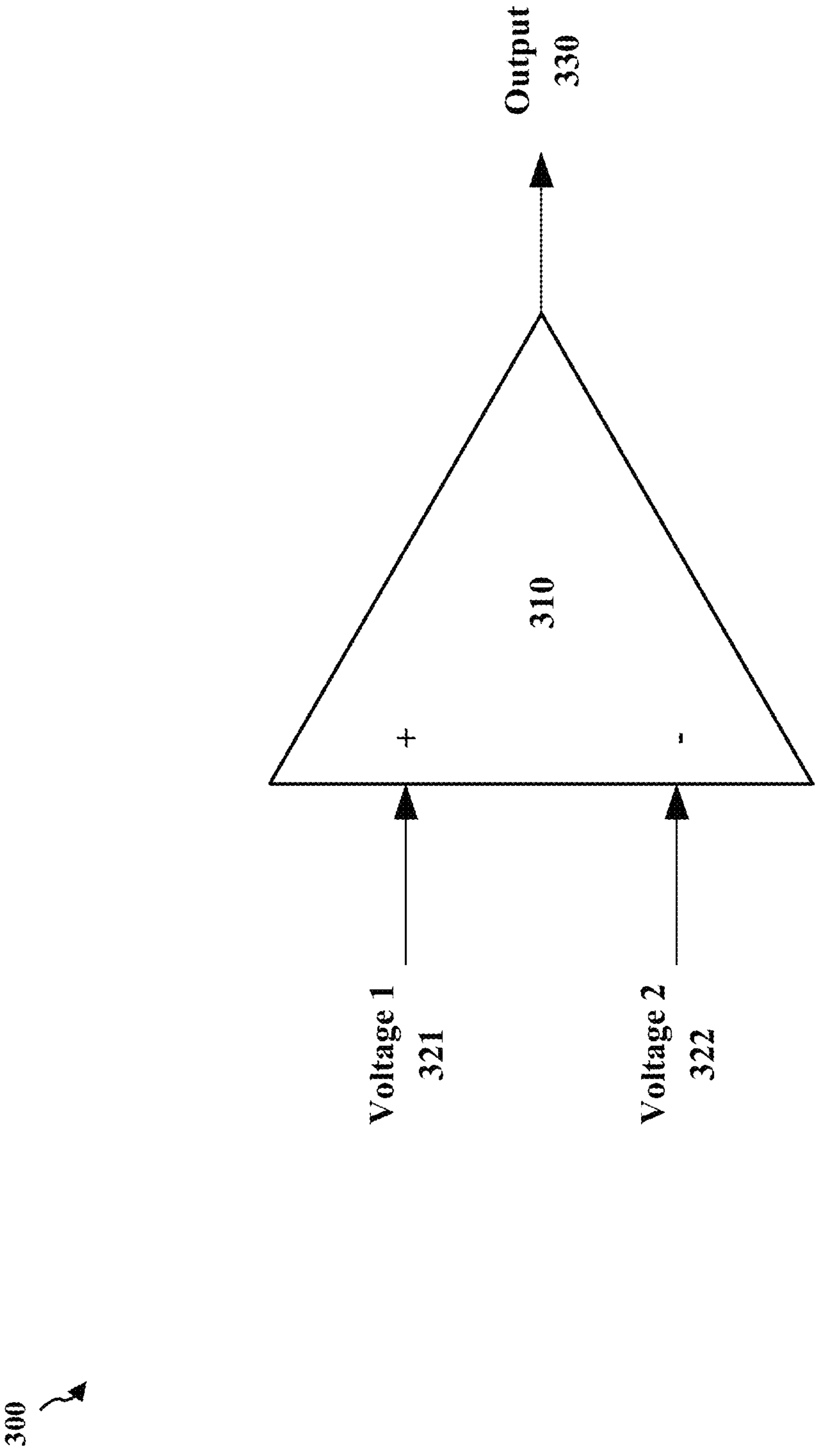
FIG. 3 is a diagram illustrating a comparator.

FIG. 3 is a diagram 300 illustrating a comparator. A comparator 310 is a fundamental building block in many electronic circuits, including analog-to-digital converters (ADCs). Its primary function is to compare two input voltages and determine which one is larger. The comparator 310 has two input terminals: a positive input 321 and a negative input 322. These inputs can be analog voltages that vary over time.

The operation of the comparator 310 is relatively straightforward. It continuously monitors the voltages at its two input terminals. If the voltage at the positive input 321 is higher than the voltage at the negative input 322, the comparator 310 produces a high output signal, typically represented as a logic level 1. Conversely, if the voltage at the negative input 322 is higher than the voltage at the positive input 321, the comparator 310 produces a low output signal, represented as a logic level 0. The output 330 of the comparator 310 is a digital signal that reflects the result of the comparison.

Comparators are used in various applications, such as ADCs, where they are used to determine the digital representation of an analog input signal.

Figure 4:
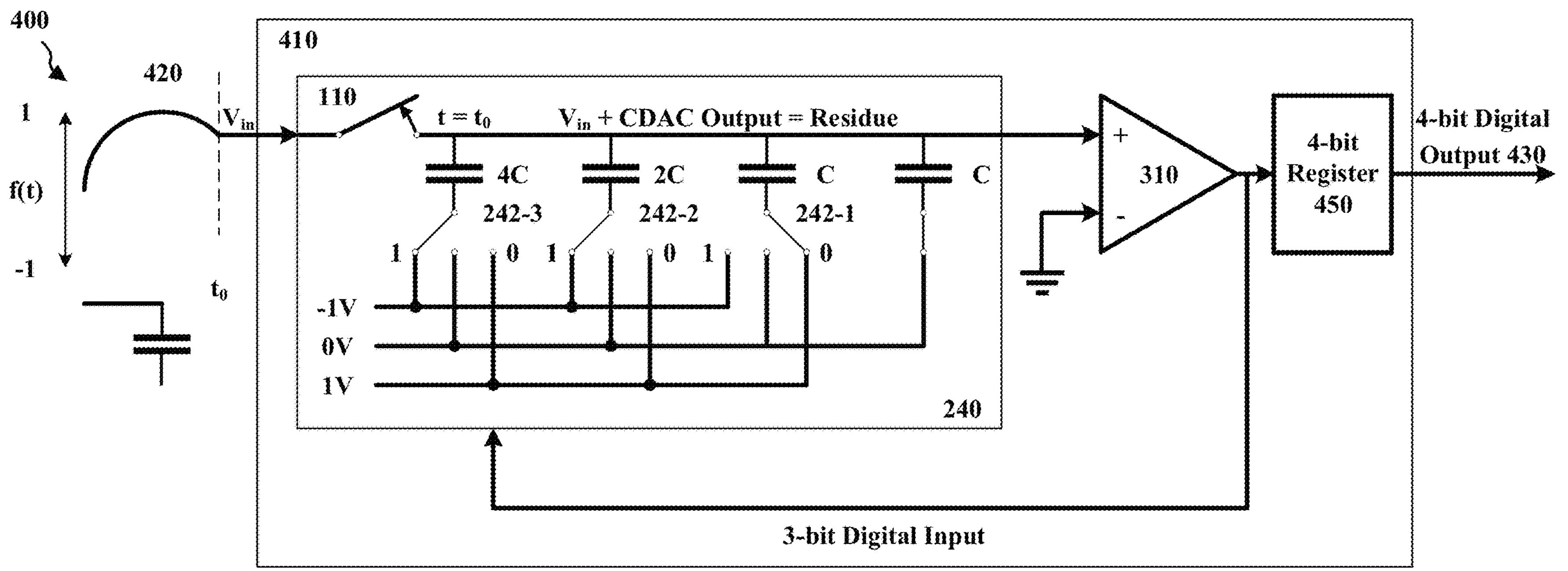
FIG. 4 is a diagram illustrating a 4-bit Successive Approximation Register (SAR) Analog-to-Digital Converter (ADC).

FIG. 4 is a diagram 400 illustrating a 4-bit Successive Approximation Register (SAR) Analog-to-Digital Converter (ADC). The SAR ADC 410 includes an analog signal sampler 110, a 3-bit capacitive digital-to-analog converter (CDAC) 240, a comparator 310, and a 4-bit register 440. The analog signal sampler 110 samples the analog input signal 420 onto the top plate of the CDAC 240, which also serves as the sampling capacitor during the sampling phase.

The SAR ADC 410 operates in a series of cycles to determine the digital output 430 that best represents the sampled analog input signal 420. In each cycle, the comparator 310 compares the voltage at the top plate of the CDAC 240, called the residue, to a reference voltage (e.g., ground). The comparator output is used to control the bottom plate voltages of the CDAC capacitors and is stored in the corresponding bit of the register 440.

Initially, the analog input signal 420 is sampled onto the top plate of the CDAC 240. In this example, the sampled value is $V_{in}$=f($t_0$)=0.7V.

In a first cycle, the bottom plates of all CDAC capacitors are initially connected to a common-mode voltage $V_{cm}$, resulting in a CDAC output of 0V. The residue, which is the sum of $V_{in}$ and the CDAC output, is 0.7V+0V=0.7V. The comparator 310 outputs a '1' since the residue is greater than 0V. This '1' is stored in the most significant bit (MSB) of the register 440 and is used to control the bottom plate of the largest capacitor (4C) in the next cycle.

In a second cycle, the bottom plate of the 4C capacitor is switched to $V_{refn}$=−1V based on the comparator output from the previous cycle. The other capacitors remain connected to $V_{cm}$. The CDAC output becomes −0.5V, and the new residue is 0.7V−0.5V=0.2V. The comparator outputs a '1', which is stored in the second bit of the register and used to control the bottom plate of the 2C capacitor in the next cycle.

In a third cycle, the bottom plates of the 4C and 2C capacitors are switched to $V_{refn}$, while the C capacitor remains at $V_{cm}$. The CDAC output becomes −0.75V, and the residue is 0.7V−0.75V=−0.05V. The comparator outputs a '0', which is stored in the third bit of the register and used to control the bottom plate of the C capacitor in the final cycle.

In a fourth and final cycle, the bottom plates of the 4C and 2C capacitors remain at $V_{refn}$, while the C capacitor is switched to $V_{refp}$=1V based on the comparator output from the previous cycle. The CDAC output becomes −0.625V, and the residue is 0.7V−0.625V=0.075V. The comparator outputs a '1', which is stored in the least significant bit (LSB) of the register.

After the four cycles, the digital output 430 is determined to be '1101', corresponding to a decimal value of 13, which best represents the sampled analog input of 0.7V.

As described, the CDAC generates a sequence of analog voltages that successively approximate the sampled input voltage. The comparator determines the sign of the residue in each cycle, which is used to control the CDAC and update the digital output.

The SAR logic aims to minimize the residue by adjusting the CDAC output based on the comparator decisions. If the residue is positive, the corresponding bit in the digital output is set to '1', and the CDAC subtracts a voltage proportional to the bit weight. If the residue is negative, the bit is set to '0', and the CDAC adds a voltage proportional to the bit weight.

The conversion process continues for a number of cycles equal to the desired output resolution (e.g., 4 cycles for a 4-bit ADC). The final digital output is the best approximation of the sampled analog input, with the residue representing the quantization error.

The last capacitor in the CDAC (the unit capacitor) is not controlled by the SAR logic and remains connected to $V_{cm}$ throughout the conversion process. Its purpose is to maintain a constant total capacitance and provide a reference for generating the residue voltage.

Figure 5:
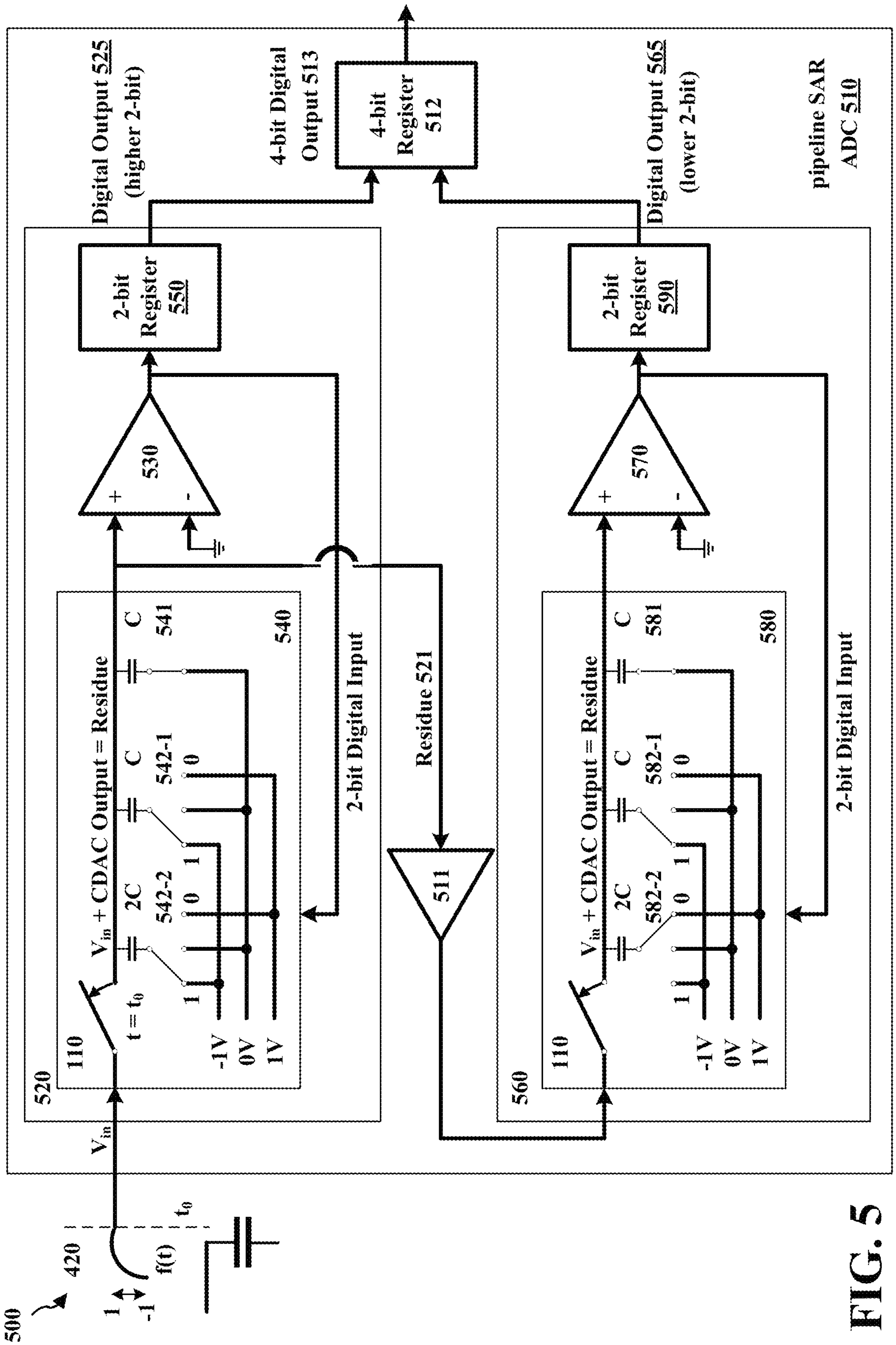
FIG. 5 is a diagram illustrating a 4-bit pipeline SAR ADC.

FIG. 5 is a diagram 500 illustrating a 4-bit pipeline SAR ADC. The pipeline architecture is used to increase the conversion speed of the SAR ADC. In this example, a 4-bit pipeline SAR ADC 510 includes a first stage 2-bit SAR ADC 520, a residue amplifier 511, and a second stage 2-bit SAR ADC 560. The first stage SAR ADC 520 and the second stage SAR ADC 560 operate concurrently, effectively doubling the conversion speed compared to a single 4-bit SAR ADC.

The first stage 2-bit SAR ADC 520 samples the analog input signal 420 at time to and performs the first two SAR cycles. The sampled value is $V_{in}=f(t_0)$, which in this example is 0.7V. The 2-bit digital output 525 of the first stage SAR ADC 520 represents the two most significant bits (MSBs) of the final 4-bit digital output 513.

After the first two SAR cycles, the first stage SAR ADC 520 generates a residue voltage 521, which represents the difference between the sampled input voltage and the analog voltage corresponding to the first two bits of the digital output. This residue voltage needs to be amplified and passed to the second stage SAR ADC 560 for further processing.

The residue amplifier 511 multiplies the residue voltage 521 by a constant gain factor (CGF) to rescale it to the full input range of the second stage SAR ADC 560. The CGF is given by:

$$CGF = \frac{V_{refp,2} - V_{refn,2}}{(V_{refp,1} - V_{refn,1})/2^{n_1}}$$

where $V_{refp,1}$ and $V_{refn,1}$ are the maximum and minimum output voltages of the first stage SAR ADC 520, $V_{refp,2}$ and $V_{refn,2}$ are the maximum and minimum output voltages of the second stage SAR ADC 560, and $n_1$ is the number of cycles in the first stage.

In this example, $V_{refp,1}=V_{refp,2}=1V$, $V_{refn,1}=V_{refn,2}=-1V$, and $n_1=2$. Therefore, the CGF is:

$$CGF = \frac{1V-(-1V)}{(1V-(-1V))/2^2} = 4$$

The amplified residue voltage is then processed by the second stage 2-bit SAR ADC 560, which performs the remaining two SAR cycles. The 2-bit digital output 565 of the second stage SAR ADC 560 represents the two least significant bits (LSBs) of the final 4-bit digital output 513.

The operation of the first two SAR cycles in the pipeline SAR ADC is identical to that of a single 4-bit SAR ADC. In the first cycle, the sampled input voltage $V_{in}=0.7V$ is held on the top plate of the CDAC 540, while the bottom plates of all capacitors are initially connected to the common mode voltage $V_{cm}$. The CDAC output is 0V, and the residue (which is also the input to the comparator 530) is Vin-$CDAC_{output}$=0.7V−0V=0.7V. The comparator 530 outputs a '1', which is used to control the capacitor 542-2 in the next cycle and is stored in the registers 550 and 512. The interim result is '1000', indicating a decimal value greater than 7. In the second cycle, $V_{in}=0.7V$ remains on the top plate of the CDAC 540. The capacitor 542-2 is switched to −1V based on the digital input from the first cycle, while the capacitor 542-1 remains connected to $V_{cm}$. The CDAC output becomes −0.5V, and the residue is $V_{in}$−$CDAC_{output}$=0.7V−(−0.5V)=0.2V. The comparator 530 outputs another '1', which controls the capacitor 542-1 in the next cycle and is stored in the registers 550 and 512. The interim result is now '1100', indicating a decimal value greater than 12.

After the second cycle, the residue voltage 521 is −0.05V. This residue is passed through the residue amplifier 511, which multiplies it by the CGF of 4, resulting in an input voltage of −0.2V for the second stage SAR ADC 560. The first stage SAR ADC 520 can now start sampling the next input value while the second stage processes the amplified residue.

In the third cycle, the amplified residue voltage $V_{in}$=−0.2V is held on the top plate of the CDAC 580 in the second stage SAR ADC 560. The bottom plates of all capacitors in the CDAC 580 are initially connected to $V_{cm}$, resulting in a CDAC output of 0V. The residue (input to the comparator 570) is $V_{in}$−$CDAC_{output}$=−0.2V−0V=−0.2V. The comparator 570 outputs a '0', which controls the capacitor 582-2 in the next cycle and is stored in the registers 590 and 512. The interim result is '1100', indicating a decimal value between 12 and 14.

In the fourth and final cycle, $V_{in}$=−0.2V remains on the top plate of the CDAC 580. The capacitor 582-2 is switched to 1V based on the digital input from the third cycle, while the capacitor 582-1 remains connected to $V_{cm}$. The CDAC output becomes 0.5V, and the residue is $V_{in}$−$CDAC_{output}$=−0.2V−0.5V=0.3V. The comparator 570 outputs a '1', which is stored in the registers 590 and 512. The final 4-bit digital output 513 is '1101', corresponding to a decimal value of 13.

The 4-bit digital output 513 of the pipeline SAR ADC 510 matches the output 430 of the single-stage 4-bit SAR ADC 410 for the same analog input, demonstrating the equivalence of the two architectures. However, the pipeline SAR ADC achieves this result in half the number of cycles, effectively doubling the conversion speed.

As described, the pipeline SAR ADC architecture splits the conversion process into two stages, each handling half the number of bits. The pipeline SAR ADC architecture uses a residue amplifier to rescale the residue voltage from the first stage to the full input range of the second stage. The pipeline SAR ADC architecture operates the two stages concurrently, with the first stage sampling the next input while the second stage processes the amplified residue from the previous sample. By employing these techniques, the pipeline SAR ADC can achieve higher conversion speeds compared to a single-stage SAR ADC with the same resolution.

Figure 6:
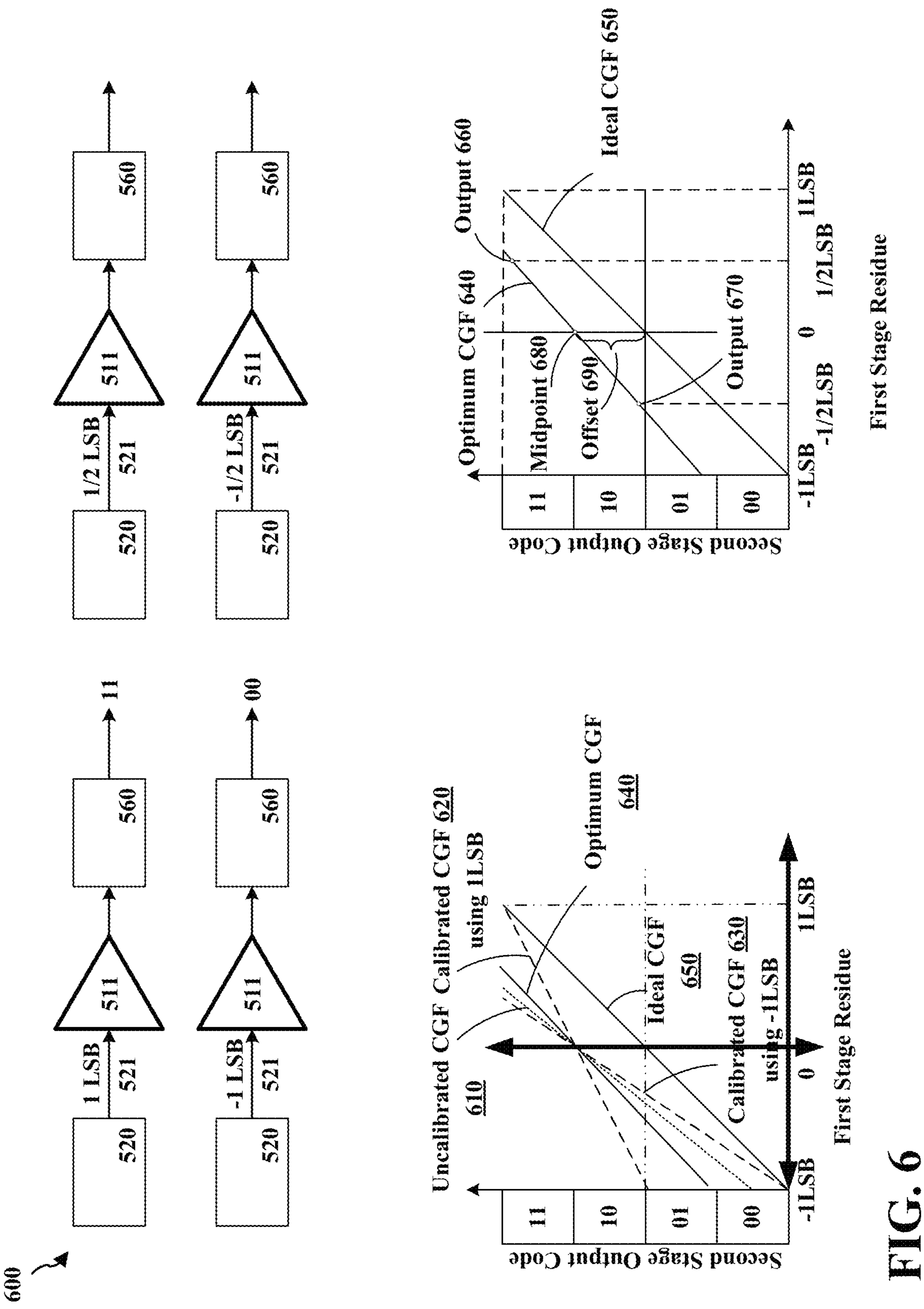
FIG. 6 is a diagram illustrating residue amplifier calibration for the constant gain factor (CGF) and residue amplifier offset measurement.

FIG. 6 is a diagram 600 illustrating residue amplifier calibration for the constant gain factor (CGF) and residue amplifier offset measurement. As mentioned earlier, the residue voltage 521 of the first stage 2-bit SAR ADC 520 needs to be rescaled for the second stage 2-bit SAR ADC 560. This is accomplished by using the residue amplifier 511 to multiply the residue by a constant gain factor (CGF). In this example, the ideal CGF 650 is given by:

$$CGF = \frac{V_{refp,2} - V_{refn,2}}{(V_{refp,1} - V_{refn,1})/2^{n_1}} = \frac{2}{2/2^2} = 4$$

where $V_{refp,1}$ and $V_{refn,1}$ are the maximum and minimum output voltages of the first stage SAR ADC 520, $V_{refp,2}$ and $V_{refn,2}$ are the maximum and minimum output voltages of the second stage SAR ADC 560, and $n_1$ is the number of cycles in the first stage.

This is the required gain from the residue amplifier 511 for the pipeline SAR ADC to work correctly. In certain configurations of the Pipeline SAR, the CGF is set as half of what is in the formula above. This allows the second stage SAR to effectively repeat one of the SAR comparisons in the first stage SAR, which reduces the 4 bit pipeline SAR to 3 bit but protects against any errors that might have occurred in the first stage SAR or the residue transfer. Since the CGF being calibrated is 2 instead of 4, 1 LSB of residue may be used for calibration.

In a first technique, to calibrate the CGF, the residue voltage 521 is set to 1 LSB and the interstage gain of the residue amplifier 511 is adjusted until the CDAC output of the second stage 2-bit SAR ADC 560 reaches its maximum positive value, corresponding to an output code of '11'. The resulting CGF is the calibrated CGF 620 using 1 LSB.

Similarly, the residue voltage 521 is set to −1 LSB and the interstage gain of the residue amplifier 511 is adjusted until the CDAC output of the second stage 2-bit SAR ADC 560 reaches its maximum negative value, corresponding to an output code of '00'. The resulting CGF is the calibrated CGF 630 using −1 LSB.

The optimum CGF 640 can be obtained by averaging the calibrated CGF 620 and CGF 630. The optimum CGF 640 matches the ideal characteristic.

In addition to an incorrect gain, the residue amplifier 511 may also have an offset 690. This means that even when there is no input to the amplifier, there is still some output, and the second stage 2-bit SAR ADC 560 receives a non-zero digital code.

One way to measure the offset 690 is to set the residue voltage 521 to ½ LSB, apply the residue voltage 521 to the residue amplifier 511 configured for the optimum CGF 640, and measure the output 660 generated from the second stage SAR ADC 560.

Subsequently, set the residue voltage 521 to −½ LSB, apply the residue voltage 521 to the residue amplifier 511 configured for the optimum CGF 640, and measure the output 670 generated from the second stage SAR ADC 560. If there is an offset, the midpoint 680 of the two outputs 660 and 670 will not be 0. If there is no offset, the midpoint 680 will be 0. If one side saturates while the other does not, it also indicates the polarity of the offset. In the example shown, there is a positive residue amplifier offset 690. In general, any equal positive and negative residue pair can be used to determine the existence and polarity of the residue amplifier offset.

In a second technique, the residue amplifier offset can be measured and calibrated without first calibrating the CGF. To measure the offset, the residue voltage 521 is set to ½ LSB and applied to the residue amplifier 511 with an initial CGF setting. The output 660 generated from the second stage SAR ADC 560 is measured.

Subsequently, the residue voltage 521 is set to −½ LSB, applied to the residue amplifier 511 with the same initial CGF setting, and the output 670 generated from the second stage SAR ADC 560 is measured. If there is an offset, the midpoint 680 of the two outputs 660 and 670 will not be 0. If there is no offset, the midpoint 680 will be 0. If one side saturates while the other does not, it also indicates the polarity of the offset.

Figure 7A:
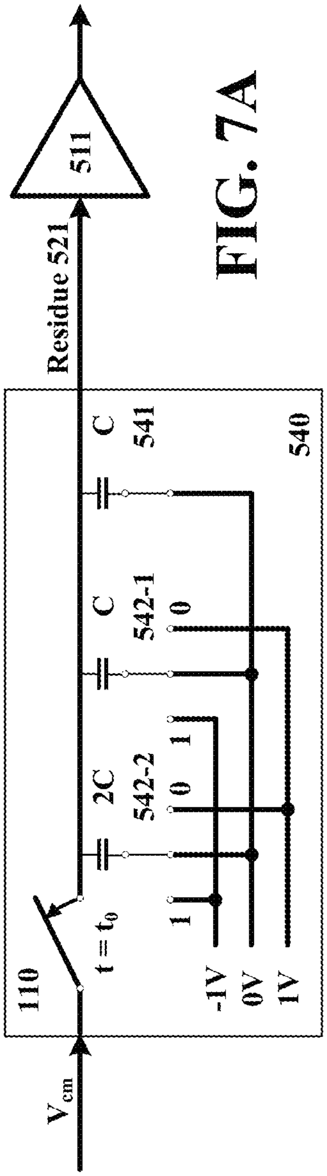
FIGS. 7A-7C are diagrams illustrating generation of residue voltages for calibration.
Figure 7B:
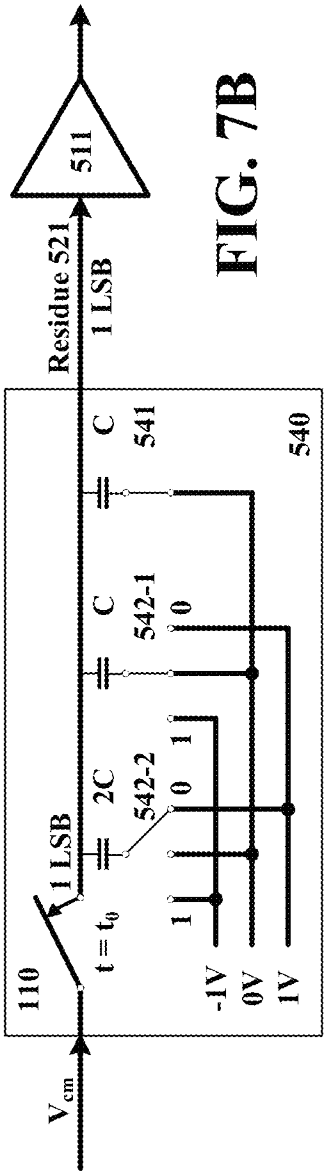
Figure 7C:
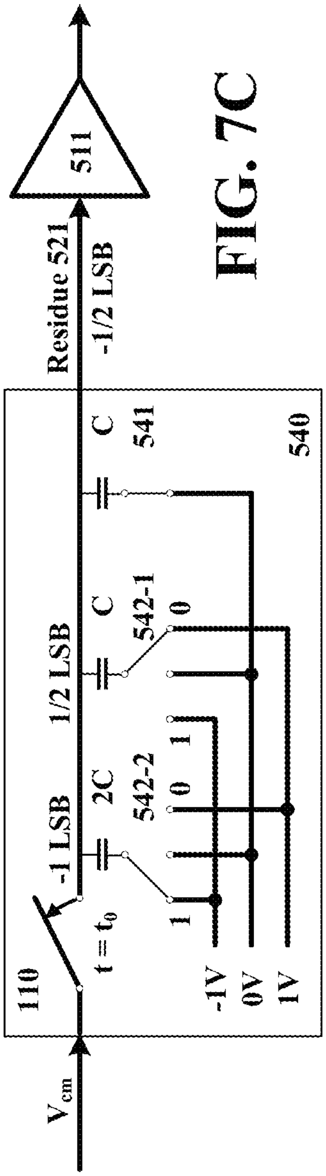
Figure 8:
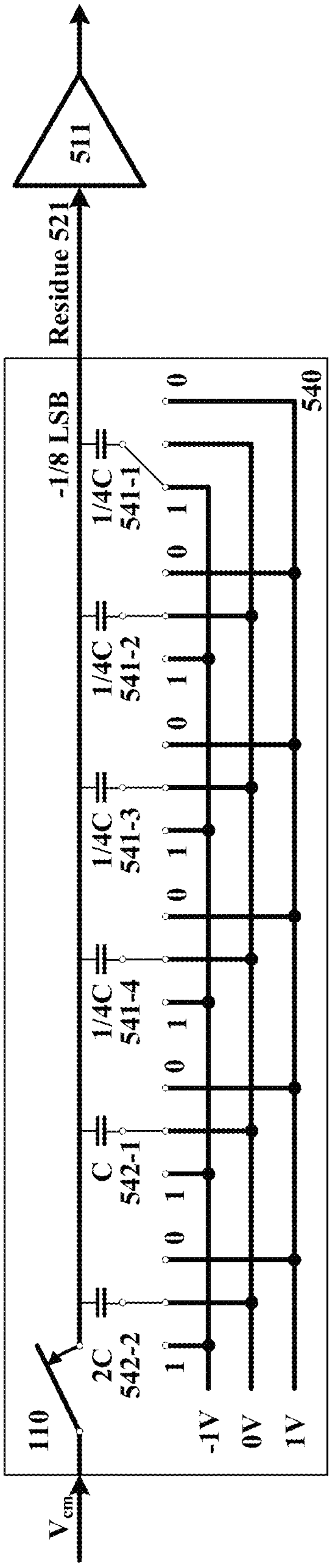
FIG. 8 is a diagram illustrating a modified CDAC for offset cancellation.
Figure 9:
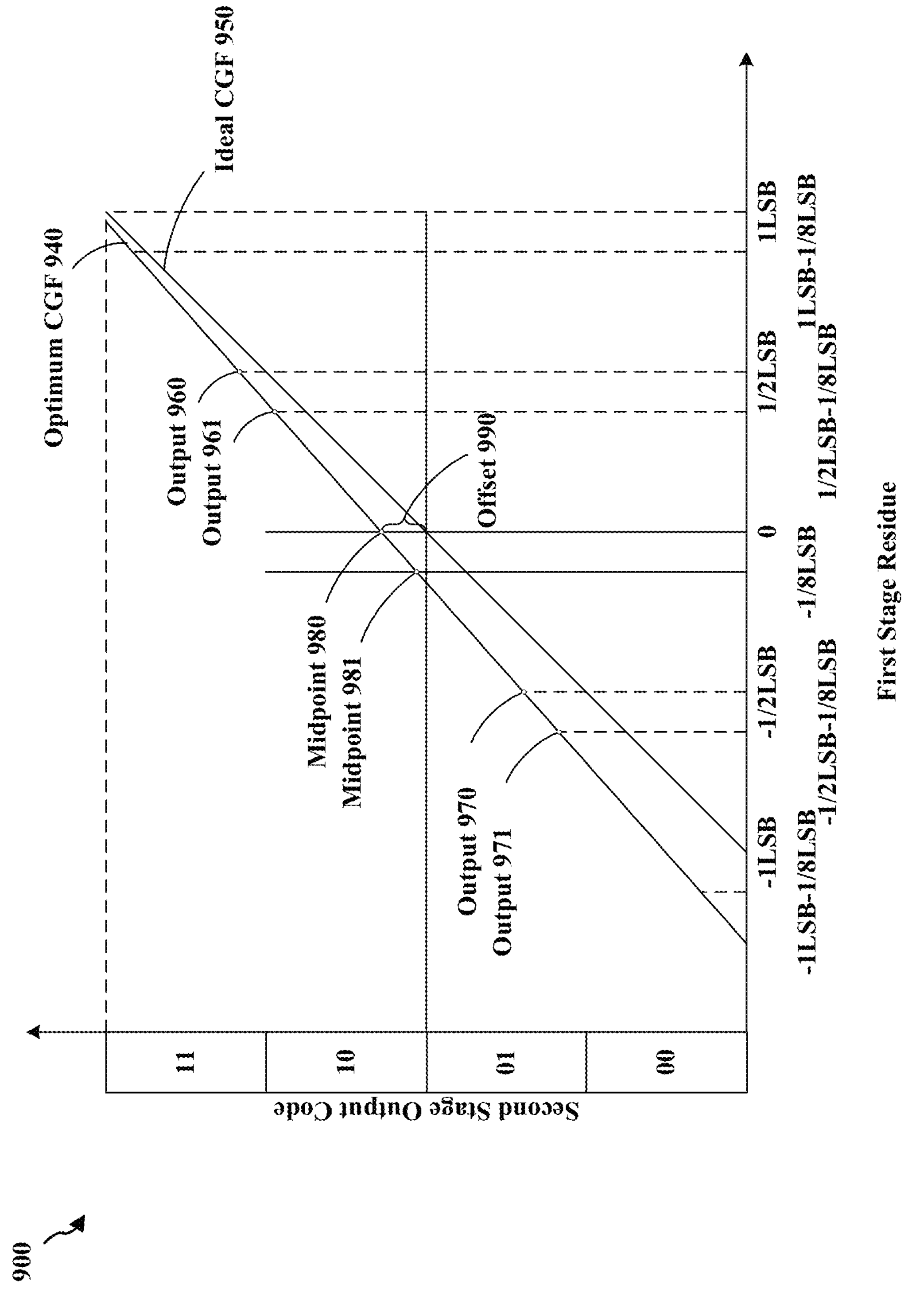
FIG. 9 is a diagram illustrating an example of residue amplifier offset cancellation.

After measuring the offset, the offset calibration process described in FIGS. 7-9 is performed to cancel the residue amplifier offset. Once the offset is calibrated, the CGF can be calibrated by setting the residue voltage 521 to 1 LSB and adjusting the interstage gain of the residue amplifier 511 until the CDAC output of the second stage 2-bit SAR ADC 560 reaches its maximum positive value, corresponding to an output code of '11'. The resulting CGF is the calibrated CGF 620 using 1 LSB. Similarly, the residue voltage 521 is set to −1 LSB and the interstage gain of the residue amplifier 511 is adjusted until the CDAC output of the second stage 2-bit SAR ADC 560 reaches its maximum negative value, corresponding to an output code of '00'. The resulting CGF is the calibrated CGF 630 using −1 LSB. The optimum CGF 640 can be obtained by averaging the calibrated CGF 620 and CGF 630.

The benefit of this second technique is that the residue amplifier offset can be measured and calibrated without the need for prior CGF calibration. This simplifies the overall calibration process and reduces the calibration time.

FIGS. 7A-7C are diagrams illustrating the generation of residue voltages for calibration using the CDAC 540 in the first stage SAR ADC 520 of the 4-bit pipeline SAR ADC 510.

In FIG. 7A, the common mode voltage $$V_{cm} = \frac{1}{2}(V_{refp} + V_{refn})$$

is sampled onto the top plate of the CDAC 540. The bottom plates of all capacitors are initially connected to $V_{cm}$. In this example, $V_{refp}$=1V, $V_{refn}$=−1V, and $V_{cm}$=0V. As a result, the top plate voltage of the CDAC 540 is 0V, and the residue voltage 521 is 0V.

In FIG. 7B, following FIG. 7A, the common mode voltage $V_{cm}$=0V is on the top plate of the CDAC 540. To generate 1 LSB of residue, the SAR trials are skipped, and the bottom plate of the capacitor 542-2 is toggled to $V_{refp}$=1V, while the bottom plates of the other capacitors remain connected to $V_{cm}$. The CDAC output voltage is given by:

$$CDAC_{output} = 2^{-(2+1-2)} \cdot V_{refp} = 0.5\text{ V}$$

The residue voltage 521 is:

$$V_{residue} = V_{in} + CDAC_{output} = 0\text{ V} + 0.5\text{ V} = 0.5\text{ V}$$

This results in exactly 1 LSB of voltage on the top plate of the CDAC 540. Similarly, to generate −1 LSB of residue, the bottom plate of the capacitor 542-2 is toggled to $V_{refn}$=−1V, resulting in a CDAC output voltage of −0.5V and a residue voltage of −0.5V.

In FIG. 7C, following FIG. 7A, the common mode voltage $V_{cm}$=0V is on the top plate of the CDAC 540. To generate −½ LSB of residue, the bottom plate of the capacitor 542-2 is toggled to $V_{refn}$=−1V, and the bottom plate of the capacitor 541-1 is toggled to $V_{refp}$=1V, while the bottom plates of the other capacitors remain connected to $V_{cm}$. The CDAC output voltage is given by:

$$CDAC_{output} = 2^{-(2+1-2)} \cdot V_{refn} + 2^{-(2+1-1)} \cdot V_{refp} = -0.25\text{ V}$$

The residue voltage 521 is:

$$V_{residue} = V_{in} + CDAC_{output} = 0\text{ V} - 0.25\text{ V} = -0.25\text{ V} = -1/2\,LSB$$

Similarly, to generate ½ LSB of residue, the bottom plate of the capacitor 542-2 is toggled to $V_{refp}$=1V, and the bottom plate of the capacitor 541-1 is toggled to $V_{refn}$=−1V, resulting in a CDAC output voltage of 0.25V and a residue voltage of 0.25V.

The generation of 1 LSB and −1 LSB residue voltages is used for calibrating the constant gain factor (CGF) of the residue amplifier 511, as described in FIG. 6. By adjusting the interstage gain of the residue amplifier 511 until the second stage SAR ADC 560 output saturates for 1 LSB or −1 LSB residue inputs, the optimum CGF can be obtained.

The generation of ½ LSB and −½ LSB residue voltages is used for measuring the residue amplifier offset, as described in FIG. 6. By comparing the second stage SAR ADC 560 output codes for ½ LSB and −½ LSB residue inputs, the existence and polarity of the residue amplifier offset can be determined. If the midpoint of the two output codes is not zero, it indicates the presence of offset, and the polarity of the offset is given by the sign of the midpoint.

FIG. 8 is a diagram illustrating offset cancellation using the modified CDAC 540 in the first stage SAR ADC 520 of the 4-bit pipeline SAR ADC 510. In this example, the capacitor 541 of the CDAC 540 is split into multiple unit capacitors (e.g., 541-1, 541-2, 541-3, 541-4) for offset cancellation. The number of unit capacitors determines the resolution of the offset cancellation.

The common mode voltage $V_{cm}$=0V is initially applied to the top plate of the CDAC 540. Toggling the bottom plate of each capacitor 541-1, 541-2, 541-3, or 541-4 from $V_{cm}$ to $V_{refp}$=1V adds ⅛ LSB to the top plate voltage of the CDAC 540. Conversely, toggling the bottom plate of each unit capacitor from $V_{cm}$ to $V_{refn}$=−1V subtracts ⅛ LSB from the top plate voltage. In this example, the bottom plate of the capacitor 541-1 is toggled to $V_{refn}$=−1V, subtracting ⅛ LSB from the top plate voltage.

The offset cancellation voltage generated is used to compensate for the residue amplifier offset 690. To cancel the residue amplifier offset, the bottom plates of the capacitors 541-1, 541-2, 541-3, and 541-4 are toggled to $V_{refn}$=−1V or $V_{refp}$=1V, depending on the polarity of the offset. The number of unit capacitors toggled determines the size of the offset cancellation, with each unit capacitor contributing ⅛ LSB of offset cancellation.

The offset cancellation process is iterative. After each offset cancellation step, the midpoint of the second stage SAR ADC 560 output codes for residue voltages of 1 LSB-offset cancellation and −1 LSB-offset cancellation is measured. If the midpoint is still non-zero, additional unit capacitors are toggled to further cancel the offset. This process continues until the midpoint is zero or closest to zero, indicating that the residue amplifier offset has been best compensated.

FIG. 9 is a diagram 900 illustrating an example of residue amplifier offset cancellation for ⅛ LSB. Before offset cancellation, the first output 960 is measured for an input residue voltage of ½ LSB, and the second output 970 is measured for an input residue voltage of −½ LSB. The midpoint 980 of the first output 960 and the second output 970 is calculated. The polarity of the midpoint 980 determines the presence and polarity of the residue amplifier offset 990. In this example, the midpoint 980 is positive, indicating a positive residue amplifier offset 990.

To cancel the positive residue amplifier offset 990, a negative offset cancellation voltage of −⅛ LSB is generated by toggling the bottom plate of the capacitor 541-1 to $V_{refn}$=−1V. A third output 961 is then measured for an input residue voltage of ½ LSB-⅛ LSB, and a fourth output 971 is measured for an input residue voltage of −½ LSB-⅛ LSB. A midpoint 981 of the third output 961 and fourth output 971 is calculated. If the midpoint 981 is zero, it indicates that the residue amplifier offset has been successfully cancelled.

If the midpoint 981 is still non-zero after the first offset cancellation step, additional unit capacitors (e.g., 541-2, 541-3, 541-4) are toggled to $V_{refn}$=−1V or $V_{refp}$=1V, depending on the polarity of the remaining offset, to generate larger offset cancellation voltages (e.g., −²⁄₈ LSB, −³⁄₈ LSB, −⁴⁄₈ LSB). The process of measuring the midpoint and applying offset cancellation is repeated until the midpoint becomes minimized in accordance with the resolution of the capacitors, indicating complete cancellation of the residue amplifier offset.

As described supra, in the first technique of obtaining the optimum CGF, the optimum CGF is obtained prior to amplifier offset cancellation. In particular, 1 LSB of residue and −1 LSB of residue are applied to the residue amplifier and the interstage gain is adjusted until the second stage SAR ADC output saturates, as described in FIG. 6. The optimum CGF is then obtained by averaging the calibrated CGF for 1 LSB and −1 LSB.

In the second technique of obtaining the optimum CGF, the optimum CGF is obtained after to amplifier offset cancellation. In particular, 1 LSB of residue and −1 LSB of residue are applied to the residue amplifier and the interstage gain is adjusted until the second stage SAR ADC output saturates, as described in FIG. 6. The optimum CGF is then obtained by averaging the calibrated CGF for 1 LSB and −1 LSB.

Once the residue amplifier 511 is calibrated with the optimum CGF and minimized offset, the offset cancellation voltage is stored as a digital code (e.g., 0001 for −⅛ LSB offset cancellation). During normal operation of the pipeline SAR ADC 510, the stored offset cancellation code is applied to the bottom plates of the capacitors 541-1, 541-2, 541-3, and 541-4 before the residue voltage 521 is amplified by the residue amplifier 511. As such, the residue amplifier offset is cancelled in real-time, enabling accurate amplification and transmission of the residue voltage to the second stage SAR ADC 560 of the pipeline SAR ADC 510.

The offset cancellation code is not applied to the CDAC 540 during the initial sampling phase and the first two SAR cycles of the first stage SAR ADC 520. During these stages, the focus is on accurately sampling the analog input signal and performing the initial conversion steps to determine the two most significant bits (MSBs) of the final digital output. Applying the offset cancellation code during the sampling phase or the first stage SAR would prohibit either to function.

The cancellation code is applied to the CDAC 540 after the first two SAR cycles of the first stage SAR ADC 520, just before the residue voltage 521 is amplified by the residue amplifier 511. At this point, the MSBs have already been determined, and the residue voltage represents the remaining information needed to complete the conversion. By applying the offset cancellation code at this stage, the residue amplifier offset is compensated; the amplified residue voltage accurately reflects the remaining analog information for the second stage SAR ADC 560 to process.

Figure 10:
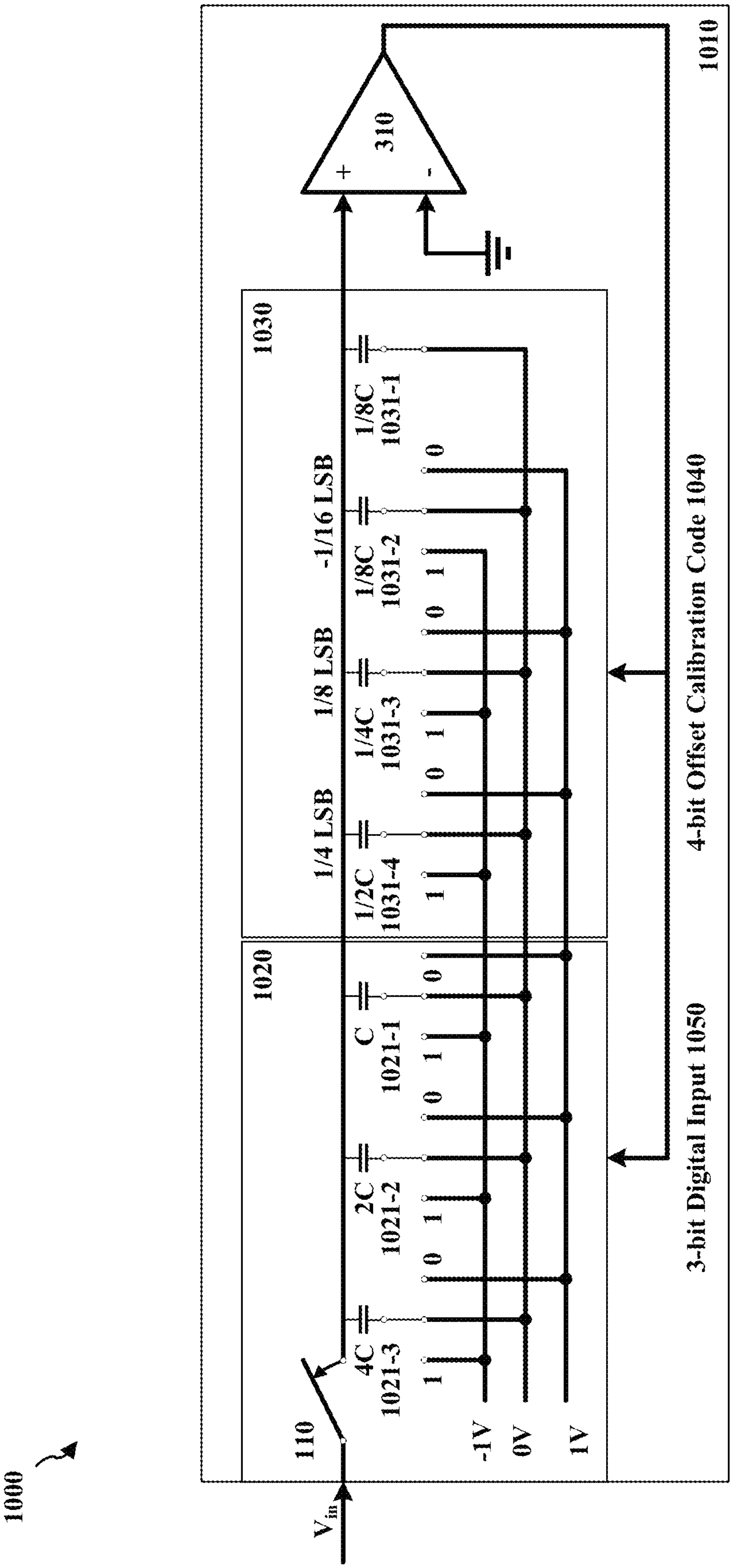
FIG. 10 is a diagram illustrating a 4-bit SAR ADC with offset cancellation.

FIG. 10 is a diagram 1000 illustrating a 4-bit SAR ADC 1010 with offset cancellation. The 4-bit SAR ADC 1010 includes a standard SAR CDAC 1020 and an offset cancellation component 1030.

The standard SAR CDAC 1020 includes a group of binary-weighted capacitors 1021. The binary-weighted capacitor group 1021 has three capacitors 1021-1, 1021-2, and 1021-3, with capacitance values of C, 2C, and 4C, respectively, where C is a unit capacitance. The capacitor group 1021 of the standard SAR CDAC 1020 generates an analog output value according to the digital input 1050, as described in FIG. 2.

The offset cancellation component 1030 includes a group of binary-weighted capacitors 1031. The binary-weighted capacitor group 1031 has four capacitors 1031-1, 1031-2, 1031-3, and 1031-4, with capacitance values of C/8, C/8, C/4, and C/2, respectively. The capacitors 1031-1 and 1031-2 can each add or subtract 1/16 LSB to the top plate of the CDAC, the capacitor 1031-3 can add or subtract 1/8 LSB, and the capacitor 1031-4 can add or subtract 1/4 LSB. The capacitor group 1031 generates a voltage for offset cancellation according to an offset calibration code 1040.

The offset calibration code 1040 is a 4-bit digital code that controls the bottom plate voltages of the capacitors 1031-1, 1031-2, 1031-3, and 1031-4. Each bit of the offset calibration code 1040 corresponds to one of the capacitors in the group 1031. A bit value of '1' connects the bottom plate of the corresponding capacitor to $V_{refp}$, while a bit value of '0' connects it to $V_{refn}$. By appropriately setting the offset calibration code 1040, the residue amplifier offset can be cancelled with a resolution of 1/16 LSB.

The offset calibration process for the 4-bit SAR ADC 1010 is similar to that described in FIGS. 6-9. First, the residue amplifier offset is measured by using the second stage output codes for ½ LSB and −½ LSB of residue, as described in FIG. 6. If a non-zero residue amplifier offset is detected, the offset calibration code 1040 is adjusted to cancel the offset. The bottom plates of the capacitors 1031-1, 1031-2, 1031-3, and 1031-4 are toggled according to the offset calibration code 1040 to generate the required offset cancellation voltage. The process of measuring the residue amplifier offset and adjusting the offset calibration code 1040 is repeated iteratively until the offset is minimized. Once the residue amplifier offset is cancelled, the final offset calibration code 1040 is stored.

Subsequently, the common mode voltage $V_{cm}$ is sampled onto the top plate of the CDAC. The SAR trials are skipped, and the bottom plates of the capacitors 1021-1, 1021-2, and 1021-3 are toggled to generate 1 LSB and −1 LSB of residue. The interstage gain of the residue amplifier is adjusted until the second stage SAR ADC output saturates for each case, and the optimum CGF is determined by averaging the calibrated CGF for 1 LSB and −1 LSB, as described in FIG. 6.

During normal operation of the 4-bit SAR ADC 1010, the stored offset calibration code 1040 is applied to the capacitor group 1031 before the residue voltage is amplified by the residue amplifier. Thus, the residue amplifier offset is cancelled in real-time, enabling accurate amplification and transmission of the residue voltage.

The use of the binary-weighted capacitor group 1031 in the offset cancellation component 1030 allows for fine-grained control over the offset cancellation voltage. By splitting the LSB capacitor into smaller units (e.g., C/8, C/4, C/2), the offset can be cancelled with a higher resolution compared to the example in FIG. 8, where the LSB capacitor was split into four equal units. This improved resolution enables more accurate cancellation of the residue amplifier offset, leading to better overall performance of the 4-bit SAR ADC 1010.

The offset cancellation technique described in FIG. 10 can be extended to SAR ADCs with different resolutions by appropriately sizing the capacitors in the offset cancellation component 1030.

The process described supra aims to determine the appropriate offset calibration code to cancel the residue amplifier offset. The process measures the residue amplifier offset by comparing the second stage output codes for ½ LSB and −½ LSB of residue, as described in FIG. 6. The polarity of the offset is determined by the midpoint of the two output codes.

If the midpoint is positive, it indicates a positive residue amplifier offset. In this case, the offset calibration code is adjusted to generate a negative offset cancellation voltage. If the midpoint is negative, it indicates a negative residue amplifier offset, and the offset calibration code is adjusted to generate a positive offset cancellation voltage.

The offset cancellation voltage is generated by toggling the bottom plates of the capacitors in the residue amplifier offset calibration modification (e.g., capacitors 1031-1, 1031-2, 1031-3, and 1031-4 in FIG. 10) according to the offset calibration code. Each capacitor contributes a specific offset cancellation voltage (e.g., 1/16 LSB, 1/8 LSB, 1/4 LSB) depending on its capacitance value.

After applying the offset cancellation voltage, the residue amplifier offset is measured again by comparing the second stage output codes for ½ LSB-offset cancellation and −½ LSB-offset cancellation. If the midpoint of the two output codes is zero, it indicates that the residue amplifier offset has been successfully cancelled.

If the midpoint is still non-zero after the first offset cancellation iteration, the offset calibration code is further adjusted to generate a larger or smaller offset cancellation voltage, depending on the polarity of the remaining offset. The process of measuring the residue amplifier offset and adjusting the offset calibration code is repeated iteratively until the midpoint becomes zero or as close to zero as possible.

Once the residue amplifier offset is minimized, the final offset calibration code is stored. During normal operation of the SAR ADC, the stored offset calibration code is applied to the capacitors in the residue amplifier offset calibration modification before the residue voltage is amplified by the residue amplifier. The residue amplifier offset is cancelled in real-time.

The offset cancellation process can be implemented in hardware using a state machine or in software using a control algorithm. The specific implementation depends on the requirements and constraints of the SAR ADC design.

The resolution of the offset cancellation voltage is determined by the number and capacitance values of the capacitors in the residue amplifier offset calibration modification. In the example shown in FIG. 10, the use of four binary-weighted capacitors (C/8, C/8, C/4, C/2) allows for an offset cancellation resolution of 1/16 LSB. By increasing the number of capacitors or adjusting their capacitance values, the resolution can be further improved, enabling more precise cancellation of the residue amplifier offset.

The offset cancellation algorithm may be performed during the calibration phase of the SAR ADC and not during normal operation. The calibration phase typically occurs at power-up or periodically during idle times to compensate for any drift in the residue amplifier offset due to temperature variations or other factors. Once the offset calibration code is determined and stored, it is applied during normal operation without the need for additional measurements or iterations.

Figure 11:
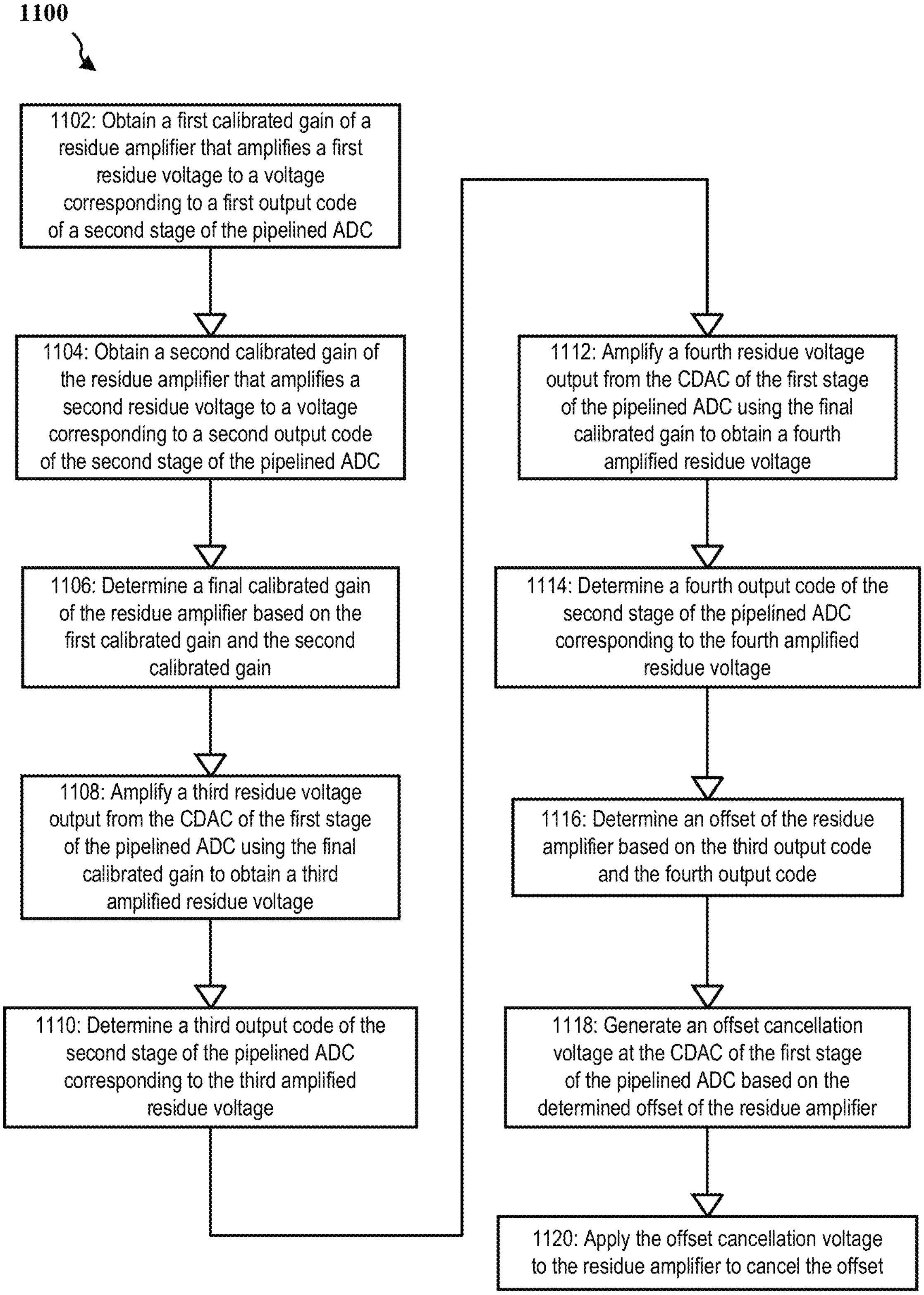
FIG. 11 is a flow chart of a method (process) for calibrating a residue amplifier in a pipelined analog-to-digital converter (ADC).

FIG. 11 is a flow chart 1100 of a method (process) for calibrating a residue amplifier in a pipelined analog-to-digital converter (ADC). The method may be performed by a controller. In operation 1102, the controller obtains a first calibrated gain of a residue amplifier that amplifies a first residue voltage to a voltage corresponding to a first output code of a second stage of the pipelined ADC. The first residue voltage is output from a capacitive digital-to-analog converter (CDAC) of a first stage of the pipelined ADC. In operation 1104, the controller obtains a second calibrated gain of the residue amplifier that amplifies a second residue voltage to a voltage corresponding to a second output code of the second stage of the pipelined ADC. The second residue voltage is also output from the CDAC of the first stage of the pipelined ADC. In certain configurations, the first residue voltage is a positive voltage and the second residue voltage is a negative voltage. The first residue voltage may correspond to 1 least significant bit (LSB) and the second residue voltage may correspond to −1 LSB.

In operation 1106, the controller determines a final calibrated gain of the residue amplifier based on the first calibrated gain and the second calibrated gain. Determining the final calibrated gain may involve calculating an average of the first calibrated gain and the second calibrated gain. In operation 1108, the residue amplifier amplifies a third residue voltage output from the CDAC of the first stage of the pipelined ADC using the final calibrated gain to obtain a third amplified residue voltage. In operation 1110, the controller determines a third output code of the second stage of the pipelined ADC corresponding to the third amplified residue voltage.

In operation 1112, the residue amplifier amplifies a fourth residue voltage output from the CDAC of the first stage of the pipelined ADC using the final calibrated gain to obtain a fourth amplified residue voltage. In operation 1114, the controller determines a fourth output code of the second stage of the pipelined ADC corresponding to the fourth amplified residue voltage. In certain configurations, the third residue voltage is a positive voltage and the fourth residue voltage is a negative voltage. The third residue voltage may correspond to ½ LSB and the fourth residue voltage may correspond to −½ LSB.

In operation 1116, the controller determines an offset of the residue amplifier based on the third output code and the fourth output code. Determining the offset of the residue amplifier may involve calculating a midpoint of the third output code and the fourth output code. In operation 1118, the controller generates an offset cancellation voltage at the CDAC of the first stage of the pipelined ADC based on the determined offset of the residue amplifier. In operation 1120, the controller applies the offset cancellation voltage to the residue amplifier to cancel the offset. In certain configurations, the offset cancellation voltage is applied to the CDAC after an initial sampling phase and a plurality of approximation cycles utilizing the CDAC.

In certain configurations, the CDAC of the first stage of the pipelined ADC includes a plurality of capacitors that are not controlled in an approximation cycle utilizing the CDAC. To generating the offset cancellation voltage, the controller may adjust one or more voltages applied to the plurality of capacitors based on the determined offset of the residue amplifier.

In certain configurations, the controller stores a digital code corresponding to the one or more voltages applied to the plurality of capacitors. During a normal operation of the pipelined ADC, the controller retrieves the stored digital code and applies the one or more voltages to the plurality of capacitors based on the retrieved digital code.

In certain configurations, the plurality of capacitors include N capacitors each having a capacitance value of C/N, where C is a capacitance value of a least significant bit (LSB) capacitor of the CDAC and N is an integer greater than 1. Alternatively, the plurality of capacitors may include N capacitors having a total capacitance value equal to a capacitance value of an LSB capacitor of the CDAC, where the plurality of capacitors are binary-weighted capacitors.

Figure 12:
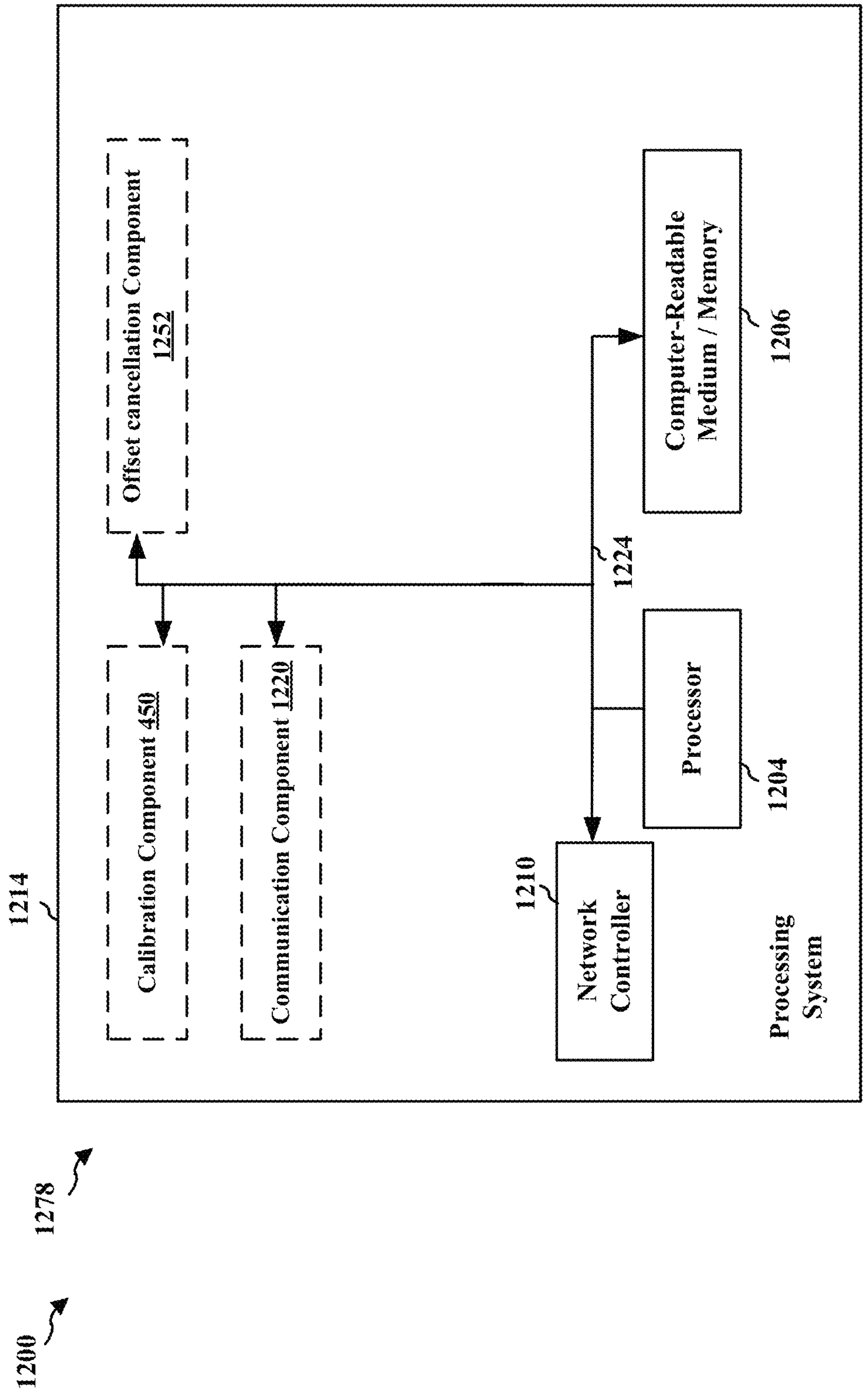
FIG. 12 is a diagram illustrating an example of a hardware implementation for an apparatus employing a processing system.

FIG. 12 is a diagram 1200 illustrating an example of a hardware implementation for an apparatus 1278 employing a processing system 1214. The apparatus 1278 may implement a calibration component 1250, and an offset cancellation component 1252. The processing system 1214 may be implemented with a bus architecture, represented generally by the bus 1224. The bus 1224 may include any number of interconnecting buses and bridges depending on the specific application of the processing system 1214 and the overall design constraints. The bus 1224 links together various circuits including one or more processors and/or hardware components, represented by a processor 1204, a network controller 1210, and a computer-readable medium/memory 1206. The bus 1224 may also link various other circuits such as timing sources, peripherals, voltage regulators, and power management circuits, which are well known in the art, and therefore, will not be described any further.

The processing system 1214 may be coupled to the network controller 1210. The network controller 1210 provides a means for communicating with various other apparatus over a network. The network controller 1210 receives a signal from the network, extracts information from the received signal, and provides the extracted information to the processing system 1214, specifically a communication component 1220 of the apparatus 1278. In addition, the network controller 1210 receives information from the processing system 1214, specifically the communication component 1220, and based on the received information, generates a signal to be sent to the network. The processing system 1214 includes a processor 1204 coupled to a computer-readable medium/memory 1206. The processor 1204 is responsible for general processing, including the execution of software stored on the computer-readable medium/memory 1206. The software, when executed by the processor 1204, causes the processing system 1214 to perform the various functions described supra for any particular apparatus. The computer-readable medium/memory 1206 may also be used for storing data that is manipulated by the processor 1204 when executing software. The processing system further includes the calibration component 1250, and the offset cancellation component 1252. The components may be software components running in the processor 1204, resident/stored in the computer readable medium/memory 1206, one or more hardware components coupled to the processor 1204, or some combination thereof.

The apparatus 1278 may include means for performing operations as described supra referring to FIG. 11. The aforementioned means may be one or more of the aforementioned components of the apparatus 1278 and/or the processing system 1214 of the apparatus 1278 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of calibrating a residue amplifier in a pipelined analog-to-digital converter (ADC), comprising:

obtaining a first calibrated gain of a residue amplifier that amplifies a first residue voltage, which is output from a capacitive digital-to-analog converter (CDAC) of a first stage of the pipelined ADC, to a voltage corresponding to a first output code of a second stage of the pipelined ADC;

obtaining a second calibrated gain of the residue amplifier that amplifies a second residue voltage, which is output from the CDAC of the first stage of the pipelined ADC, to a voltage corresponding to a second output code of the second stage of the pipelined ADC;

determining a final calibrated gain of the residue amplifier based on the first calibrated gain and the second calibrated gain;

amplifying, by the residue amplifier, a third residue voltage output from the CDAC of the first stage of the pipelined ADC using the final calibrated gain to obtain a third amplified residue voltage;

determining a third output code of the second stage of the pipelined ADC corresponding to the third amplified residue voltage;

amplifying, by the residue amplifier, a fourth residue voltage output from the CDAC of the first stage of the pipelined ADC using the final calibrated gain to obtain a fourth amplified residue voltage;

determining a fourth output code of the second stage of the pipelined ADC corresponding to the fourth amplified residue voltage; and determining an offset of the residue amplifier based on the third output code and the fourth output code.

2. The method of claim 1, wherein the first residue voltage is a positive voltage and the second residue voltage is a negative voltage.

3. The method of claim 2, wherein the first residue voltage corresponds to 1 least significant bit (LSB) and the second residue voltage corresponds to −1 LSB.

4. The method of claim 1, wherein determining the final calibrated gain comprises calculating an average of the first calibrated gain and the second calibrated gain.

5. The method of claim 1, wherein the third residue voltage is a positive voltage and the fourth residue voltage is a negative voltage.

6. The method of claim 5, wherein the third residue voltage corresponds to ½ LSB and the fourth residue voltage corresponds to −½ LSB.

7. The method of claim 1, wherein determining the offset of the residue amplifier comprises calculating a midpoint of the third output code and the fourth output code.

8. The method of claim 1, further comprising:

generating an offset cancellation voltage at the CDAC of the first stage of the pipelined ADC based on the determined offset of the residue amplifier; and applying the offset cancellation voltage to the residue amplifier to cancel the offset.

9. The method of claim 8, wherein the CDAC of the first stage of the pipelined ADC includes a plurality of capacitors that are not controlled in an approximation cycle utilizing the CDAC, and wherein generating the offset cancellation voltage comprises:

adjusting one or more voltages applied to the plurality of capacitors based on the determined offset of the residue amplifier.

10. The method of claim 9, further comprising:

storing a digital code corresponding to the one or more voltages applied to the plurality of capacitors; and during a normal operation of the pipelined ADC, retrieving the stored digital code and applying the one or more voltages to the plurality of capacitors based on the retrieved digital code.

11. The method of claim 9, wherein the plurality of capacitors include N capacitors each having a capacitance value of C/N, where C is a capacitance value of a least significant bit (LSB) capacitor of the CDAC and N is an integer greater than 1.

12. The method of claim 9, wherein the plurality of capacitors include N capacitors having a total capacitance value equal to a capacitance value of a least significant bit (LSB) capacitor of the CDAC, wherein the plurality of capacitors are binary-weighted capacitors.

13. The method of claim 8, wherein the offset cancellation voltage is applied to the CDAC after an initial sampling phase and a plurality of approximation cycles utilizing the CDAC.

14. An apparatus for calibrating a residue amplifier in a pipelined analog-to-digital converter (ADC), the apparatus being a controller, comprising:

a memory; and at least one processor coupled to the memory and configured to:

obtain a first calibrated gain of a residue amplifier that amplifies a first residue voltage, which is output from a capacitive digital-to-analog converter (CDAC) of a first stage of the pipelined ADC, to a voltage corresponding to a first output code of a second stage of the pipelined ADC;

obtain a second calibrated gain of the residue amplifier that amplifies a second residue voltage, which is output from the CDAC of the first stage of the pipelined ADC, to a voltage corresponding to a second output code of the second stage of the pipelined ADC;

determine a final calibrated gain of the residue amplifier based on the first calibrated gain and the second calibrated gain;

amplify, by the residue amplifier, a third residue voltage output from the CDAC of the first stage of the pipelined ADC using the final calibrated gain to obtain a third amplified residue voltage;

determine a third output code of the second stage of the pipelined ADC corresponding to the third amplified residue voltage;

amplify, by the residue amplifier, a fourth residue voltage output from the CDAC of the first stage of the pipelined ADC using the final calibrated gain to obtain a fourth amplified residue voltage;

determine a fourth output code of the second stage of the pipelined ADC corresponding to the fourth amplified residue voltage; and determine an offset of the residue amplifier based on the third output code and the fourth output code.

15. The apparatus of claim 14, wherein the first residue voltage is a positive voltage and the second residue voltage is a negative voltage.

16. The apparatus of claim 15, wherein the first residue voltage corresponds to 1 least significant bit (LSB) and the second residue voltage corresponds to −1 LSB.

17. The apparatus of claim 14, wherein the at least one processor is further configured to determine the final calibrated gain by calculating an average of the first calibrated gain and the second calibrated gain.

18. A computer-readable medium storing computer executable code for operation of a controller, comprising code to:

obtain a first calibrated gain of a residue amplifier that amplifies a first residue voltage, which is output from a capacitive digital-to-analog converter (CDAC) of a first stage of a pipelined analog-to-digital converter (ADC), to a voltage corresponding to a first output code of a second stage of the pipelined ADC;

obtain a second calibrated gain of the residue amplifier that amplifies a second residue voltage, which is output from the CDAC of the first stage of the pipelined ADC, to a voltage corresponding to a second output code of the second stage of the pipelined ADC; and determine a final calibrated gain of the residue amplifier based on the first calibrated gain and the second calibrated gain;

amplify, by the residue amplifier, a third residue voltage output from the CDAC of the first stage of the pipelined ADC using the final calibrated gain to obtain a third amplified residue voltage;

determine a third output code of the second stage of the pipelined ADC corresponding to the third amplified residue voltage;

amplify, by the residue amplifier, a fourth residue voltage output from the CDAC of the first stage of the pipelined ADC using the final calibrated gain to obtain a fourth amplified residue voltage;

determine a fourth output code of the second stage of the pipelined ADC corresponding to the fourth amplified residue voltage; and determine an offset of the residue amplifier based on the third output code and the fourth output code.

* * * * *